US012382583B2

(12) United States Patent
Angier et al.

(10) Patent No.: US 12,382,583 B2
(45) Date of Patent: Aug. 5, 2025

(54) TWO-BOARD RIGID FLEX PRINTED CIRCUIT BOARD FOR AUTOMOTIVE CAMERAS

(71) Applicant: NIO Technology (Anhui) Co., Ltd., Hefei (CN)

(72) Inventors: Bradley J. Angier, Santa Cruz, CA (US); Oren Rajuan, San Jose, CA (US); Dhruv Shah, Milpitas, CA (US); Karanbir S. Gill, Milpitas, CA (US); Waylon Y. Chen, San Jose, CA (US); Matthew L. Samson, San Jose, CA (US)

(73) Assignee: NIO Technology (Anhui) Co., Ltd., Hefei (JP)

( * ) Notice: Subject to any disclaimer, the term of this patent is extended or adjusted under 35 U.S.C. 154(b) by 127 days.

(21) Appl. No.: 18/116,738

(22) Filed: Mar. 2, 2023

(65) Prior Publication Data

US 2023/0328890 A1    Oct. 12, 2023

Related U.S. Application Data

(60) Provisional application No. 63/323,951, filed on Mar. 25, 2022.

(51) Int. Cl.
*H05K 1/14*      (2006.01)
*G03B 17/02*   (2021.01)
(Continued)

(52) U.S. Cl.
CPC ............. *H05K 1/147* (2013.01); *G03B 17/02* (2013.01); *H04N 23/51* (2023.01); *H04N 23/54* (2023.01);
(Continued)

(58) Field of Classification Search
CPC .......... H05K 1/147; H05K 1/144; H05K 1/18; H04N 23/51; H04N 23/54; G03B 17/02
(Continued)

(56) References Cited

U.S. PATENT DOCUMENTS 9,860,978 B1   1/2018  Liu et al.
10,630,872 B2  4/2020  Sauer et al.
(Continued)

FOREIGN PATENT DOCUMENTS

| JP | 2007-022364 | 1/2007 |
| KR | 10-2337287 | 12/2021 |
| WO | WO 2021/103907 | 6/2021 |

OTHER PUBLICATIONS

Extended European Search Report for European Patent Application No. 23164029.3, dated Aug. 8, 2023 11 pages.

*Primary Examiner* — Joel W Fosselman
(74) *Attorney, Agent, or Firm* — Sheridan Ross PC

(57) ABSTRACT

A camera assembly includes a first printed circuit board separated from a second printed circuit board. A flex circuit electrically connects the first printed circuit board to the second printed circuit board. An image sensor is attached to the first printed circuit board and a connector is attached to the second printed circuit board. The image sensor of the camera assembly is mechanically and physically separate from the connector. The first printed circuit board is connected to the second printed circuit board via a flexible circuit. The flexible circuit is elastically moveable between an assembled state and a disassembled state.

20 Claims, 6 Drawing Sheets

(51) Int. Cl.
*H04N 23/51* (2023.01)
*H04N 23/54* (2023.01)
*H05K 1/18* (2006.01)

(52) U.S. Cl.
CPC ............... *H05K 1/144* (2013.01); *H05K 1/18* (2013.01); *H05K 2201/042* (2013.01); *H05K 2201/10151* (2013.01)

(58) Field of Classification Search
USPC ........................................................ 348/374
See application file for complete search history.

(56) References Cited

U.S. PATENT DOCUMENTS

2018/0152609 A1\* 5/2018 Wang ..................... H04N 7/18
2019/0116298 A1 4/2019 Tsai \* cited by examiner

TWO-BOARD RIGID FLEX PRINTED CIRCUIT BOARD FOR AUTOMOTIVE CAMERAS

CROSS-REFERENCE TO RELATED APPLICATIONS

The present application claims the benefit of and priority, under 35 U.S.C. § 119(e), to U.S. Provisional Application Ser. No. 63/323,951, filed on Mar. 25, 2022, entitled "TWO-BOARD RIGID FLEX PRINTED CIRCUIT BOARD FOR AUTONOMOUS DRIVING CAMERAS," the entire disclosure of which is hereby incorporated herein by reference, in its entirety, for all that it teaches and for all purposes.

TECHNICAL FIELD

The present disclosure is generally directed to printed circuit board interconnections, in particular, toward flexible interconnections between rigid printed circuit boards.

BACKGROUND

Most automotive cameras (e.g., autonomous driving cameras, etc.) require a very tight alignment between the image sensor and a lens stack. This alignment may have a tolerance within microns to ensure image quality and reliability. The image sensor is typically attached to a printed circuit board (PCB) along with a number of other components and connectors. These components and connection interfaces can present unwanted shifting of the image sensor due to mechanical strain and thermal expansion. One of these connection interfaces may include an external connector such as a FAKRA (e.g., a standard connector used in high-frequency telematics, etc.) connector that provides an interconnection between the PCB and a wiring harness. As a connection is made to the PCB from the wiring harness, via the FAKRA connector, the force of the connection may cause the imaging sensor (e.g., disposed on the same PCB) to misalign with the lens stack. Other power dissipating integrated circuits may present large temperature gradients, which add to misalignment due to thermal warpage.

BRIEF SUMMARY

It is with respect to the above issues and other problems that the embodiments presented herein were contemplated. In some examples, an assembly is provided that separates the image sensor of an automotive camera (e.g., an autonomous driving camera, backup camera, cabin camera, etc.) assembly from the external connector (e.g., FAKRA connector, coaxial connector, Ethernet connector, etc.) and high power electrical components from one another. For instance, the image sensor may be arranged on a first rigid PCB and by arranging the connector, or any other connector or jack, and integrated circuits on a second rigid PCB. The first rigid PCB may be connected to the second rigid PCB via a flexible circuit (e.g., a flexible PCB, or flex, etc.). In this manner, any forces subjected to the connector and second rigid PCB cannot pass to the image sensor and first PCB, and heat conduction to the image sensor (e.g., from the second rigid PCB, etc.) is significantly reduced or eliminated.

The rigid flex approach described herein, which may include, for example, a flex circuit with an integrated board-to-board connector that connects two discrete rigid PCBs, offers a number of advantages over conventional connection schemes. For instance, the camera assembly described herein minimizes strain/movement on the optics package (e.g., from forces at a PCB) and enables precision alignment at the connector interface. Continuing this example, the connector (e.g., FAKRA connector, coaxial connector, Ethernet connector, etc.) can be arranged relative to a portion of the housing by positively fastening the PCB (on which the connector is attached) to a portion of the housing that includes the connector shroud, latch, and/or other feature. Since the image sensor PCB and the connector PCB are physically separated from one another, the flex circuit that electrically connects the image sensor PCB to the connector PCB allows for significant misalignment between the two PCBs and prevents stress and/or strain from transferring from one PCB to another. Other benefits may include, but are in no way limited to, providing different types of isolation between the two PCBs such as thermal isolation, stress/strain isolation, mechanical datums isolation, assembly process isolation, and/or the like. Some examples of two-board rigid flex arrangements or architectures may include, but are in no way limited to, using one continuous rigid flex connection: rigid-flex-rigid, using one board-to-board connector (B2BC): rigid-B2BC-flex-rigid, using one B2BC: rigid-flex-B2BC-rigid, using two B2BCs: rigid-B2BC-flex-B2BC-rigid, not using any B2BC: rigid-flex-rigid, and/or the like, where "rigid" refers to a rigid board (e.g., PCB), "flex" refers to a flex circuit, "B2BC" refers to a board-to-board connector, and where each "-" in the flex arrangements described following the colon indicates a connection between the components. Stated another way, the flex circuit may be arranged to interconnect two rigid boards (e.g., PCBs) together using connector-less interconnections (e.g., interconnections that do not employ or use connectors between the flex circuit and the rigid boards (e.g., PCBs), etc.), connector interconnections (e.g., interconnections that include at least one connector attached to the flex circuit and that connects to at least one of the two rigid boards), and/or combinations thereof.

Additionally or alternatively, the flex circuit may be attached to the image sensor PCB via a board-to-board connector. The board-to-board connector may correspond to a surface mount connector that is attached to the flex circuit. In some examples, a stiffener (e.g., a metal plate, or rigid backing, etc.) may be adhered to the flex circuit on a side of the flex circuit opposite the board-to-board connector. This stiffener may be sized to the size of the board-to-board connector and/or a size slightly larger than the area of the board-to-board connector. In any event, the connector board (e.g., the connector PCB, etc.) may be selectively connected to the image sensor board (e.g., the image sensor PCB, etc.) via the board-to-board connector on the flex circuit and a receiving connector on the image sensor board. Among other things, this approach allows the image sensor board to be mounted to a first portion (e.g., front housing, etc.) of the housing of the camera assembly independently of mounting the connector board to a second portion (e.g., rear housing, etc.) of the housing of the camera assembly, or vice versa. Once both of the boards (e.g., the image sensor board and the connector board) are connected to the respective housing portions (e.g., the front housing and the rear housing, respectively), the flex circuit may be connected from the connector board to the image sensor board via the board-to-board connector. This arrangement can improve assembly of the components making up the camera assembly, allow for serviceability of the camera assembly, and/or ensure reliable connections between the image sensor board and the connector board without requiring long lengths and/or multiple folds of the flex circuit.

The preceding is a simplified summary of the disclosure to provide an understanding of some aspects of the disclosure. This summary is neither an extensive nor exhaustive overview of the disclosure and its various aspects, embodiments, and configurations. It is intended neither to identify key or critical elements of the disclosure nor to delineate the scope of the disclosure but to present selected concepts of the disclosure in a simplified form as an introduction to the more detailed description presented below. As will be appreciated, other aspects, embodiments, and configurations of the disclosure are possible utilizing, alone or in combination, one or more of the features set forth above or described in detail below.

Numerous additional features and advantages are described herein and will be apparent to those skilled in the art upon consideration of the following Detailed Description and in view of the figures.

BRIEF DESCRIPTION OF THE SEVERAL VIEWS OF THE DRAWINGS

The accompanying drawings are incorporated into and form a part of the specification to illustrate several examples of the present disclosure. These drawings, together with the description, explain the principles of the disclosure. The drawings simply illustrate preferred and alternative examples of how the disclosure can be made and used and are not to be construed as limiting the disclosure to only the illustrated and described examples. Further features and advantages will become apparent from the following, more detailed, description of the various aspects, embodiments, and configurations of the disclosure, as illustrated by the drawings referenced below.

DETAILED DESCRIPTION

Figure 1A:
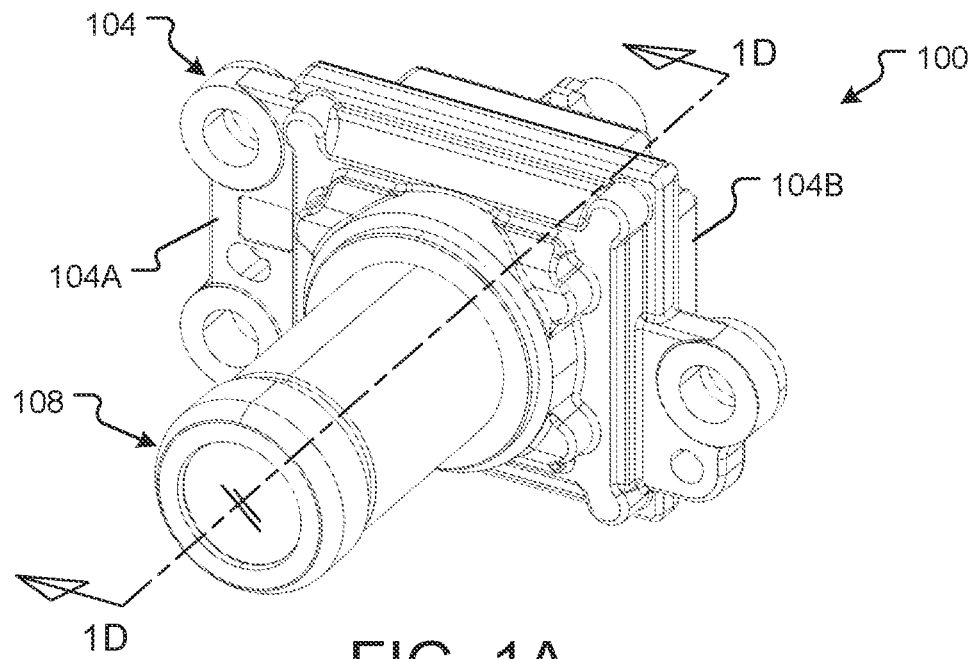
FIG. 1A shows a front perspective view of a camera assembly in accordance with examples of the present disclosure.
Figure 1B:
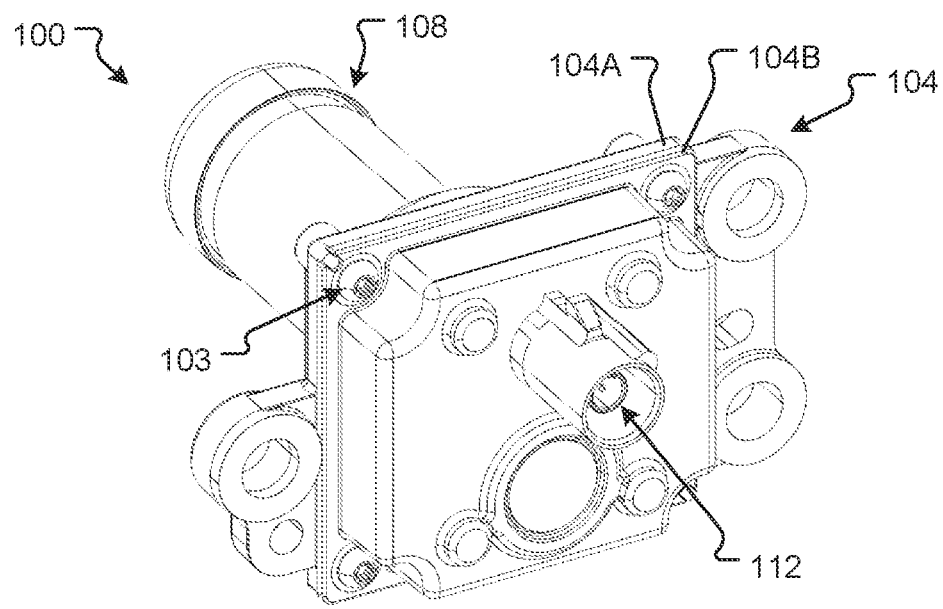
FIG. 1B shows rear perspective view of the camera assembly in accordance with examples of the present disclosure

Before any embodiments of the disclosure are explained in detail, it is to be understood that the disclosure is not limited in its application to the details of construction and the arrangement of components set forth in the following description or illustrated in the drawings. The disclosure is capable of other embodiments and of being practiced or of being carried out in various ways. Also, it is to be understood that the phraseology and terminology used herein is for the purpose of description and should not be regarded as limiting. The use of "including," "comprising," or "having" and variations thereof herein is meant to encompass the items listed thereafter and equivalents thereof as well as additional items. Further, the present disclosure may use examples to illustrate one or more aspects thereof. Unless explicitly stated otherwise, the use or listing of one or more examples (which may be denoted by "for example," "by way of example," "e.g.," "such as," or similar language) is not intended to and does not limit the scope of the present disclosure.

The ensuing description provides embodiments only, and is not intended to limit the scope, applicability, or configuration of the claims. Rather, the ensuing description will provide those skilled in the art with an enabling description for implementing the described embodiments. It being understood that various changes may be made in the function and arrangement of elements without departing from the spirit and scope of the appended claims.

Various aspects of the present disclosure will be described herein with reference to drawings that may be schematic illustrations of idealized configurations.

In general, automotive cameras (e.g., autonomous driving cameras, backup cameras, etc.) require a tight alignment between an image sensor and a lens assembly, or lens stack. This alignment may require an alignment tolerance to be within microns to ensure image quality and reliability at the image sensor. In conventional systems, the image sensor is typically attached to a printed circuit board (PCB), or board, along with a number of other components and connectors. These components and connection interfaces can present unwanted shifting of the image sensor due to mechanical strain and thermal expansion. One of these connectors may include a FAKRA connector that provides an interconnection between the board, or camera assembly, and a wiring harness. As a connection is made to the board from the wiring harness (e.g., via the FAKRA connector), the force of the connection may cause an image sensor (e.g., that is disposed on the same PCB as the connector) to misalign with the lens stack. Other power dissipating integrated circuits or heat generating elements (e.g., processors, chips, etc.) may generate heat (e.g., during use, etc.) that results in large temperature gradients inside a typical camera assembly housing, which can add to misalignment between the image sensor and the lens stack (e.g., due to thermal expansion, etc.).

It is with respect to the above issues and other problems that the embodiments presented herein were contemplated.

Referring now to FIGS. 1A-1F, various views of a camera assembly 100 are shown in accordance with examples of the present disclosure. The camera assembly 100 may comprise a housing 104 and a lens assembly 108. The lens assembly 108 may include one or more lenses that are arranged to direct light from an opening aperture toward or onto a focal plane. Examples of the lens assembly 108 may correspond to a camera lens assembly or lens stack (e.g., one or more lenses, lens elements, or lens groups, arranged adjacent to another along an optical axis 109, or in a focal plane). The housing 104 may comprise a front housing 104A and a rear housing 104B. The front housing 104A may be fastened, or otherwise attached, to the lens assembly 108 (e.g., via one or more fasteners, clamps, hooks, etc., and/or combinations thereof) so as the front housing 104A is fixed in relation to the lens assembly 108 to form a first sub-assembly, thereby maintaining the alignment between the center of the image sensor and the optical axis 109. For instance, during active alignment, the position of the lens assembly relative to the image sensor 118 may be determined based on a focus of a predetermined image, or images, detected by the image sensor 118 as the lens assembly 108 is moved relative to the image sensor 118 and/or the front housing 104A. Continuing this example, when the focus is determined to be within a preset threshold, the lens assembly 108 may be fixed to the front housing 104A and relative to the image sensor 118. The fixation may be provided via an ultraviolet (UV) cure adhesive that is disposed between a portion of the lens assembly 108 and the front housing 104A. A UV light may cure the adhesive in place securing the lens assembly 108 (and the optical axis thereof) relative to the center of the image sensor 118. In this way, the center of the image sensor will remain aligned with the optical axis 109 after the process of active alignment, thereby avoiding any misalignment between the center of the image sensor and the optical axis and eliminating the need for any realignments. The front housing 104A may be fastened, or otherwise attached, to the rear housing 104B (e.g., via one or more fasteners 103, clamps, hooks, etc., and/or combinations thereof) forming the housing 104. In some examples, a seal gasket 114 may be disposed between the front housing 104A and the rear housing 104B. The seal gasket 114 may correspond to a compliant gasket, O-ring, and/or the like. In one example, as the front housing 104A is fastened to the rear housing 104B, the seal gasket 114 disposed therebetween may compress and form a seal between the front housing 104A and the rear housing 104B. In some examples, the front housing 104A may be fastened to the rear housing 104B via one or more bolts, screws, clamps, etc. The lens assembly 108 may be mounted to the front housing 104A. In examples where the front housing 104A and the lens assembly 108 form the first sub-assembly, the rear housing 104B (and components thereof) may form a second sub-assembly, such that the second sub-assembly is removably attached to the second sub-assembly. As a result, the first sub-assembly and the second sub-assembly may be separable from one another (e.g., to enable inspection or repair of one or more components of the first and/or second sub-assemblies).

Figure 1C:
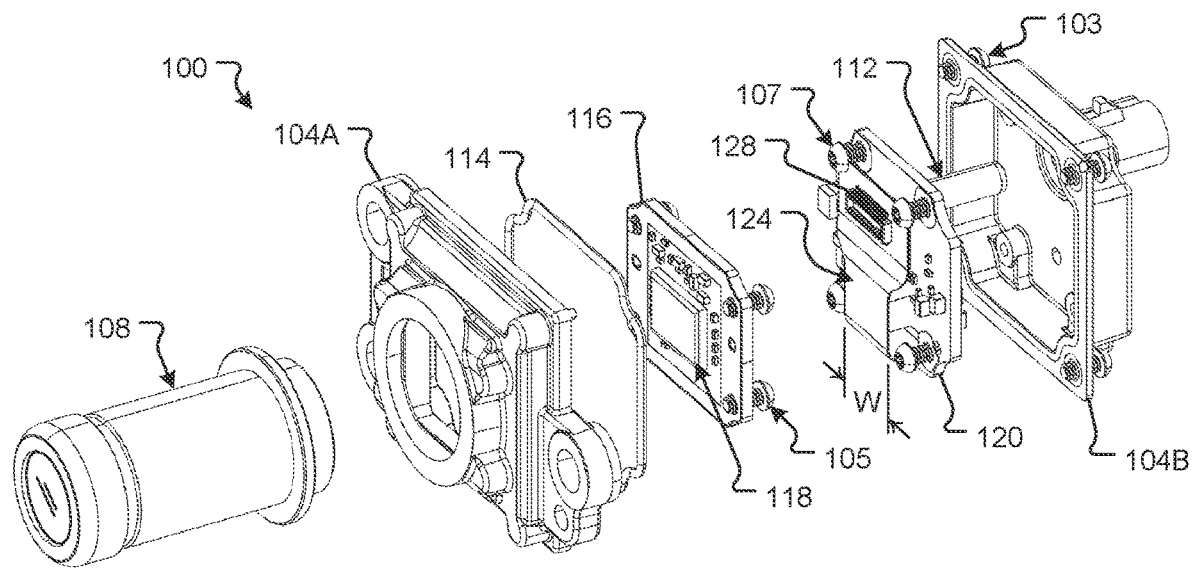
FIG. 1C shows a front exploded perspective view of the camera assembly, where the flex circuit is shown in a folded state, in accordance with examples of the present disclosure.

Referring to FIG. 1C, a front exploded view of the camera assembly 100 is shown in accordance with examples of the present disclosure. As illustrated in FIG. 1C, the camera assembly 100 may include an image sensor board 116 that is mounted to the front housing 104A and a connector board 120 that is mounted to the rear housing 104B. The image sensor board 116 may comprise an image sensor 118 arranged on a first surface of the image sensor board 116. The image sensor 118 may be arranged in the focal plane of the lens assembly 108 (as described above). For instance, the lens assembly 108 may be attached to the front housing 104A and a focal point 111 of the lens assembly 108 may be arranged at the image sensor 118. A second surface of the image sensor board 116 may include a receiving connector 138 (shown in FIGS. 1D-1F) facing the rear housing 104B. In any event, the image sensor board 116 may be fastened to the front housing 104A via one or more fasteners 105 (e.g., bolts, screws, etc.). In some examples, the image sensor may correspond to any sensor that is capable of detecting any conveying data used to create an image (e.g., a charge-coupled device (CCD), a complementary metal-oxide semiconductor (CMOS), and/or some other imager). Although shown folded in FIG. 1C, the flex circuit 124 is moveable between a folded state and an unfolded state depending on the assembly state of the camera assembly 100 and/or depending on an arrangement of the image sensor board 116 relative to the connector board 120. In some examples, the lens assembly 108 can be fastened to the front housing 104A to form the first sub-assembly such that the optical axis 109 of the lens assembly 108 is aligned with the center of the image sensor 118. In various examples, the lens assembly 108 and the front housing 104A may be permanently fastened together, such that the optical axis 109 remains fixed relative to the center of the image sensor 118.

The connector board 120 may comprise a connector 112 attached to a second side surface of the connector board 120. The connector 112 may correspond to a FAKRA, coaxial, Ethernet or other connector, that transfers power and/or communications from an area outside of the camera assembly 100 to the connector board 120 and/or the image sensor board 116. The connector 112 may be soldered, fused, fastened, or otherwise attached or affixed to the connector board 120. In some examples, the connector 112 may align with a protrusion in the rear housing 104B of the camera assembly 100. The connector board 120 may be fastened to the rear housing 104B via one or more fasteners 107 (e.g., bolts, screws, etc.).

The image sensor board 116 and/or the connector board 120 may be rigid PCBs. For instance, the image sensor board 116 and/or the connector board 120 may correspond to a laminated board (e.g., comprising at least one insulating layer and at least one layer of electrical traces disposed thereon or therein) made from rigid materials that are bonded together. Providing separate rigid PCBs that are attached to respective portions of the housing 104 offers a number of advantages and benefits over conventional arrangements. For example, the image sensor board 116 can be aligned, mounted, and/or fastened to the front housing 104A independently of aligning, mounting, and/or fastening the connector board 120. Continuing this example, the connector board 120 can be aligned, mounted, and/or fastened to the rear housing 104B independently of aligning, mounting, and/or fastening the image sensor board 116. This separate alignment and mounting of each board 116, 120 to a respective housing 104A, 104B allows manufacturing and assembly for each portion with different alignment tolerances. Stated another way, the alignment precision and tolerances required for assembly does not have to be the same for both boards 116, 120. In some embodiments, the connector board 120 may be disposed entirely within the rear housing 104B, while the image sensor board 116 may be disposed entirely within the front housing 104A. In one embodiment, the connector board 120 may be disposed within a periphery of the rear housing 104B and the image sensor board 116 may be disposed within a periphery of the front housing 104A. At least some benefits of the present disclosure include being able to mount the connector board 120 to the rear housing 104B independently of the image sensor board 116 being mounted to the front housing 104A. In this manner, the image sensor board 116, the front housing 104A, and the lens assembly 108 may be precision aligned (e.g., via active alignment etc.) while the connector board 120 can be separately attached to the rear housing 104B (e.g., without requiring precise alignment). During assembly of the front housing 104A to the rear housing 104B, the image sensor board 116 may be joined to the connector board 120 via a flex circuit 124, flex cable, and/or the like. This arrangement provides a precision alignment of the optical axis 109 of the lens assembly 108 relative to the image sensor 118 to be maintained independently of any other manufacturing tolerances of the camera assembly 100.

Figure 1D:
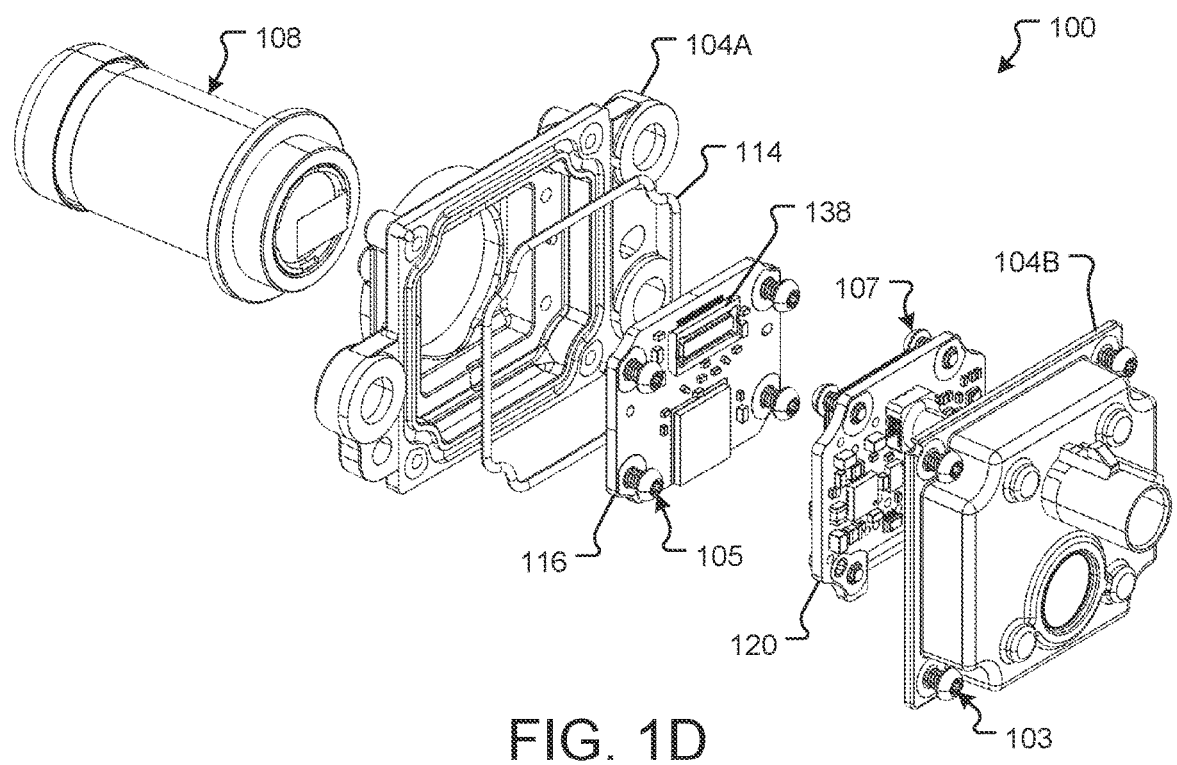
FIG. 1D shows a rear exploded perspective view of the camera assembly, where the flex circuit is in a folded state, in accordance with examples of the present disclosure.
Figure 1E:
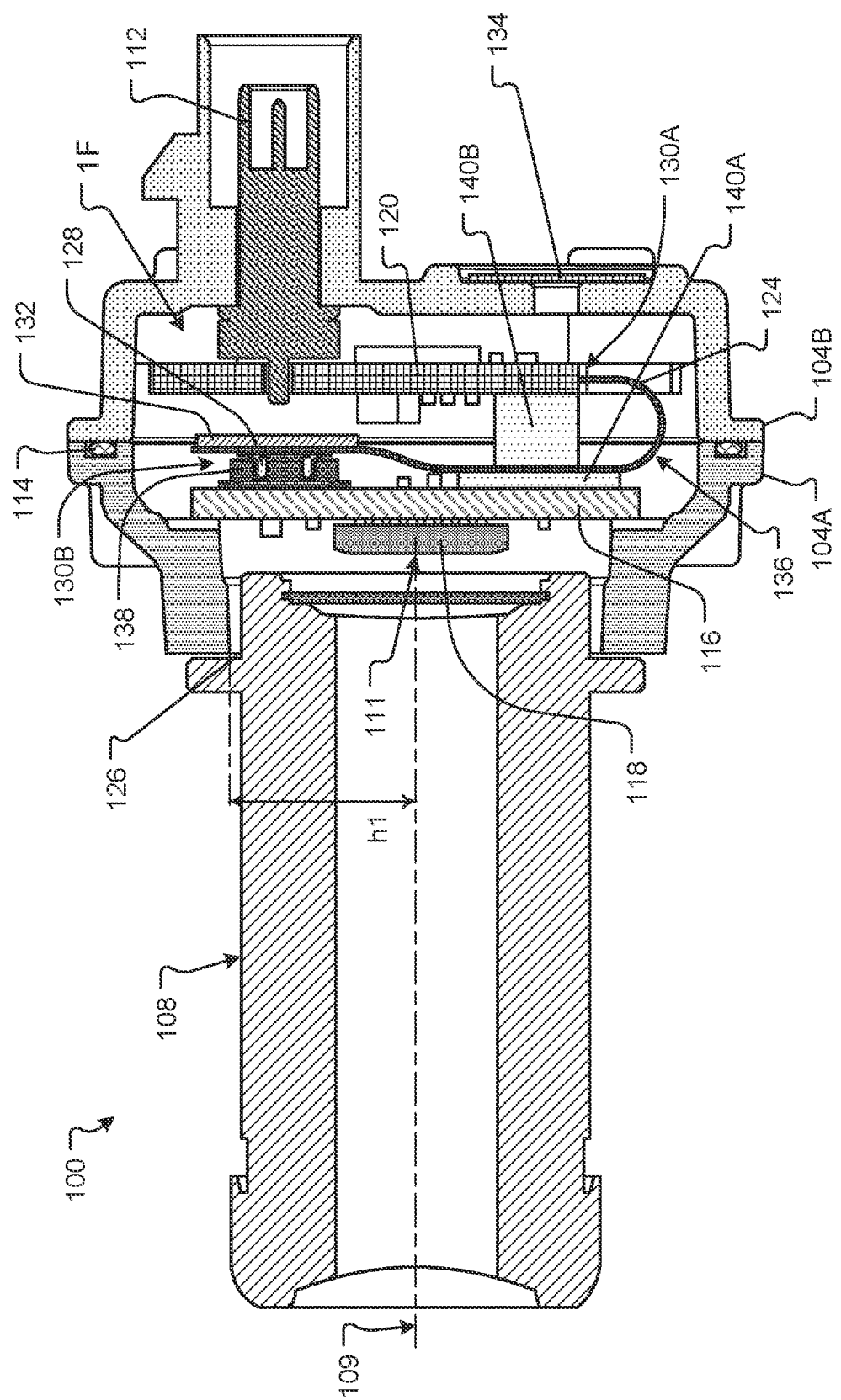
FIG. 1E shows a cross-sectional view of the camera assembly taken through line 1D-1D of FIG. 1A in accordance with examples of the present disclosure.

In some aspects, a flex circuit 124 may be a portion of a rigid-flex or a rigid-flex-rigid printed circuit board. The flex circuit 124 may be electrically and mechanically interconnected to the connector board 120 at a first connection point 130A and may interconnect with the image sensor board 116 via a board-to-board connector 128 and receiving connector 138 interface (as shown in FIGS. 1D-1E) at a second connection point 130B. The flex circuit 124 may correspond to an elastic flexible circuit having a width, W, and extending a length from a first end of the flex circuit 124 to a second end of the flex circuit 124. In some examples, the flex circuit 124 may correspond to a thin material layer having one or more printed circuit traces bonded to the thin material layer. The thin material layer may correspond to a material having a thickness less than 0.030 inches. In some examples, the thickness may be between 0.005 inches and 0.010 inches thick. The flex circuit 124 may include a polyimide substrate layer (e.g., as the thin material layer, etc.) and one or more copper traces (e.g., as the printed circuit traces, etc.).

As shown in the cross-sectional view of FIG. 1E, the flex circuit 124 may include a board-to-board connector 128 that, when interconnected to the receiving connector 138, is disposed at a second connection point 130B. Several components and/or portions of the camera assembly 100 shown in other figures have been removed in FIG. 1E for the sake of clarity in disclosure. The board-to-board connector 128 may correspond to a surface mount connector that is bonded and/or soldered to the flex circuit 124. In one example, a stiffener 132, or stiffener plate, may be bonded to a side of the flex circuit 124 at the board-to-board connector 128. The stiffener 132 may provide rigidity and support for the board-to-board connector 128 when connecting and disconnecting with the receiving connector 138 attached to the image sensor board 116. The stiffener 132 may be made from any rigid material and may include, but is in no way limited to, aluminum, steel, plastic, composite, a glass-reinforced epoxy laminate (e.g., FR-4, etc.), combinations thereof, and/or the like. The board-to-board connector 128 of the flex circuit 124 may selectively and/or repeatedly engage and disengage with the receiving connector 138 of the image sensor board 116. Among other things, this arrangement allows the image sensor board 116 to be separated (e.g., electrically and/or physically) from the connector board 120 during assembly, disassembly, maintenance, etc. In one example, the connector board 120 may be mounted to the rear housing 104B independently of the image sensor board 116 being mounted to the front housing 104A, or vice versa. Accordingly, the assembly of one half of the housing 104 and camera assembly 100 may be performed independently from the other half of the housing 104 and camera assembly 100. When the front housing 104A is ready to be attached to the rear housing 104B, the flex circuit 124 may be interconnected to the image sensor board 116 by engaging the board-to-board connector 128 of the flex circuit 124 with the receiving connector 138 of the image sensor board 116. In some examples, the board-to-board connector 128 may correspond to a plug-type connector and the receiving connector 138 may correspond to a receptacle-type connector, or vice versa.

In any event, since there is no direct rigid connection between the image sensor board 116 and the connector board 120, any forces subjected to the connector board 120 are prevented from passing to the image sensor board 116. By way of example, when a connection is made to the connector 112 (e.g., via latching a FAKRA cable, etc., to the connector 112), the force may only be transmitted to the connector board 120. In this example, the force of the connection may be absorbed by the main flex bend 136 in the flex circuit 124, which may flex or move without transferring the force to the image sensor board 116. In some examples, at least a portion of the main flex bend 136 may be arranged outside of an area or outer periphery of the image sensor board 116. Among other things, this arrangement of the main flex bend 136 may provide a service loop and/or controlled length of the flex circuit 124. This service loop may allow for greater handling ability and access during attachment and/or detachment of the board-to-board connector 128 from the receiving connector 138 when the rear housing 104B is separated from the front housing 104A. In some examples, the main flex bend 136 may be arranged in a U-shaped loop when the flex circuit 124 is in a connected state (e.g., when the board-to-board connector 128 and the receiving connector 138 are interconnected) and when the front housing 104A and the rear housing 104B are attached to one another. Other shapes of the loop may include, but are in no way limited to, S-shaped, W-shaped, M-shaped, N-shaped, combinations thereof, and/or the like.

In addition to the mechanical isolation between the image sensor board 116 and the connector board 120, or the connector 112 of the connector board 120, the flex circuit 124 may allow the image sensor board 116 to be out of alignment from the connector board 120. Accordingly, the image sensor board 116 and/or the image sensor 118 may be aligned to the lens assembly 108, or vice versa, while the connector board 120 and/or the connector 112 may be aligned to the rear housing 104B. This separate alignment allows precise respective alignments that are independent of one another. As illustrated in FIG. 1E, the lens assembly 108 may comprise a lens tube that extends into a portion of the front housing 104A. The lens tube may be sized to fit within an opening of the front housing 104A such that positional alignment of the optical axis 109 may be adjusted relative to a center of the image sensor 118. In some embodiments, a gap between the outer periphery of the lens tube and the opening of the front housing 104A may allow adjustment of the lens assembly 108 in a direction that is perpendicular to the optical axis 109 (e.g., in a direction toward the top and/or bottom of the page as shown in FIG. 1E and/or in a direction into and out of the page as shown in FIG. 1E). Once the optical axis 109 is aligned to the center of the image sensor 118, the lens assembly 108 may be bonded, fused, adhered, welded, or otherwise affixed to the front housing 104. This affixing of the lens assembly 108 to the front housing may maintain a position of the optical axis 109 relative to the image sensor 118.

The flexible cable connection of the flex circuit 124 between the image sensor board 116 and the connector board 120 allows for, among other things, misalignment between the image sensor board 116 and the connector board 120 and decouples the forces and thermal effects acting on the image sensor 118. Rather than utilizing a permanent attachment between the image sensor board 116 and the connector board 120, the camera assembly 100 described herein provides a separation of the image sensor board 116 and the connector board 120. Among other things, this separation prevents force and heat transfer to the image sensor board 116, thus aiding in maintaining precision optical alignment. Additionally or alternatively, the present camera assembly 100 allows for a complete separation of the image sensor board 116 and the connector board 120, which aids in design freedom for mounting the image sensor board 116 and the connector board 120 and how the module is assembled.

In some examples, the camera assembly 100 may include a first foam block 140A and a second foam block 140B, that contacts different sides of the flex circuit 124 between the image sensor board 116 and the connector board 120. These foam blocks 140A, 140B may prevent movement of the flex circuit 124 between the image sensor board 116 and the connector board 120. For instance, in a vehicle application, where bouncing or bumping may be observed during travel, these foam blocks 140A, 140B may hold or restrain movement of the flex circuit 124. Stated another way, as the camera assembly 100 is moved, jostled, or vibrated, the foam blocks 140A, 140B may prevent the flex circuit 124 from moving inside the housing 104 and potentially damaging components therein. The foam blocks 140A, 140B may be compliant and, in some cases, prevent forces from transmitting from the connector board 120 to the image sensor board 116, or vice versa. The foam blocks 140A, 140B may be made from closed-cell foam, open-cell foam, sponge material, dielectric foam, polyurethane foam, compliant materials, springs, etc., and/or combinations thereof.

Figure 1F:
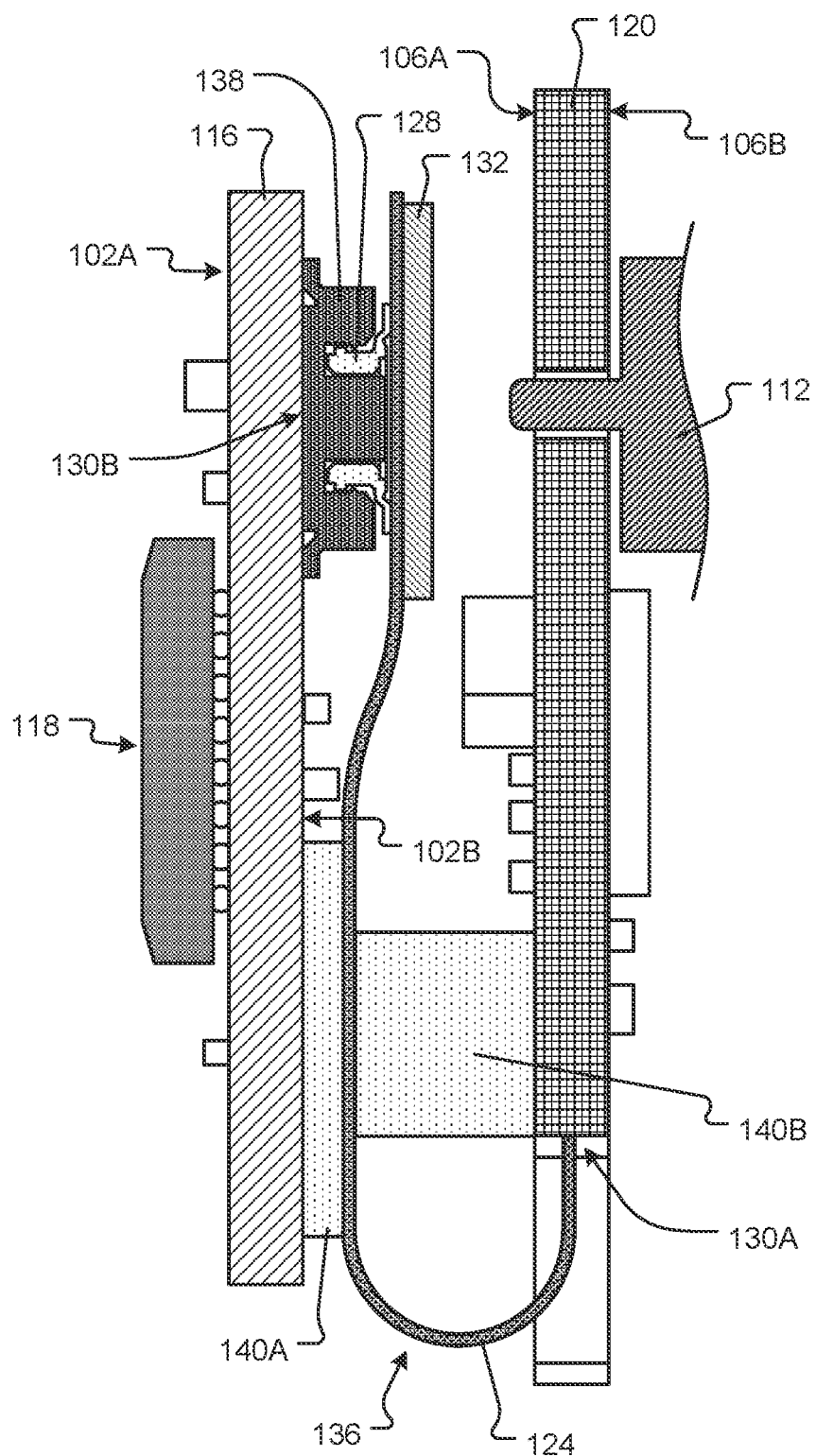
FIG. 1F is a detail cross-sectional view of the flex circuit connection of the camera assembly shown in FIG. 1E in accordance with examples of the present disclosure.

Referring now to FIG. 1F, a detail cross-sectional view of the flex circuit 124 and connection of the camera assembly 100 is shown in accordance with examples of the present disclosure. Several components and/or portions of the camera assembly 100 (e.g., the housing 104, lens assembly 108, etc., have been removed in FIG. 1F for the sake of clarity in disclosure. As illustrated in FIG. 1F, a two-board rigid flex PCB arrangement for a camera assembly 100 may include an image sensor 118 attached to a first surface 102A of the image sensor board 116. The image sensor board 116 may comprise a second surface 102B that is disposed opposite the first surface 102A. The first surface 102A and the second surface 102B are separated by a thickness of the image sensor board 116. In some examples, the image sensor board 116 may include a receiving connector 138 that is attached to the second surface 102B. As previously described, the image sensor board 116 may be attached to the front housing 104A (not shown in FIG. 1F).

The connector board 120 may include a first side surface 106A and a second side surface 106B disposed opposite the first side surface 106A. The first side surface 106A and the second side surface 106B are separated from one another by a thickness of the connector board 120. The connector board 120 may be attached to the rear housing 104B (not shown in FIG. 1F). In any case, the connector board 120 may be offset a distance from the image sensor board 116 (e.g., providing a space therebetween, etc.). The connector 112 may be electrically and/or physically attached to the second side surface 106B of the connector board 120.

The flex circuit 124 may be connected to the connector board 120 at the first connection point 130A and extend, along a main flex bend 136 and length, to the second connection point 130B. In some examples, the attachment at the first connection point 130A may correspond to an adhesive connection, a soldered connection, a connector-to-connector interface, other interconnection, and/or combinations thereof. The flex circuit 124 may extend a length from a first end (e.g., at the first connection point 130A) to a second end (e.g., at the second connection point 130B). The flex circuit 124 may include a board-to-board connector 128 attached to the flex circuit 124 at the second end. In some examples, a stiffener 132 may be attached to the flex circuit 124 at the second end. As illustrated in FIG. 1F, the stiffener 132 is attached to a side of the flex circuit 124 opposite the side of the flex circuit 124 where the board-to-board connector 128 is attached. However, in some cases, the stiffener 132 may be disposed on a same side as the board-to-board connector 128.

As the flex circuit 124 extends the length from the first end to the second end, a main flex bend 136 is formed at least partially in the space between the image sensor board 116 and the connector board 120. The main flex bend 136 of the flex circuit 124 may be arranged outside of an area or outer periphery of the image sensor board 116 when the flex circuit 124 is connected to the image sensor board 116 at the second connection point 130B. Among other things, this arrangement provides an amount of the flex circuit 124 that may serve as a service loop, provide flexibility between the image sensor board 116 and the connector board 120, reduce, absorb, or even eliminate forces between the connector board 120 and the image sensor board 116, etc.

In some examples, such as when the lens assembly 108 and the front housing 104A form the first sub-assembly and the rear housing 104B forms the second sub-assembly, the second sub-assembly may be detached from and movable relative to the first sub-assembly (and vice versa) to access the image sensor board 116, the connector board 120, the flex circuit 124, and/or other components disposed within the housing 104 for maintenance and/or inspection. For example, the second sub-assembly may be detached from the first sub-assembly, and the flex circuit 124 may be replaced. In such an example, the replacement of the flex circuit 124 can occur without disrupting the image sensor board 116, enabling the image sensor 118 to remain aligned with the optical axis 109 of the lens assembly 108. In one embodiment, this selective attachment allows a precise alignment to be maintained between the image sensor 118 and the optical axis 109 of the lens assembly 108 with the front housing 104, even when the rear housing 104B is separated from the front housing 104A.

In some examples, the housing 104 may be or comprise material with a predetermined thermal coefficient or coefficient of thermal expansion. The predetermined thermal coefficient may enable calculation of an amount of expansion or contraction of the housing 104 when the temperature of the environment surrounding the camera assembly changes. In other words, the housing 104 may contract (or expand) a predetermined amount and in a predictable manner per unit of temperature decrease (or increase) (e.g., per a change in temperature of one degree Celsius, per a change in temperature of one degree Fahrenheit, etc.), depending on the value of the thermal coefficient.

The thermal coefficient may be used to calculate an amount of change in the position of the lens assembly relative to the image sensor 118 as the housing 104 expands or contracts. As depicted in FIG. 1E, a distance h1 (e.g., a height) between the image sensor 118 and a joint location 126 may be known, predetermined, or determined (e.g., during manufacturing and/or assembly of the camera assembly 100). The joint location 126 may be the point at which the lens assembly 108 is affixed to the front housing 104A to form the first sub-assembly. The lens assembly 108 may be affixed to the front housing 104A at the joint location 126, for example, with laser welding, gluing (e.g., using UV-cured adhesives or other materials), fastening (e.g., using bolts, screws, clamps, etc.), combinations thereof, and the like. In some cases, the lens assembly 108 may be affixed to the front housing 104A at additional or alternative locations.

When the camera assembly 100 is in an environment where the temperature increases or decreases, the distance h1 may respectively increase or decrease as the housing 104 expands or contracts. The new distance h1 may be calculated (e.g., based the predetermined thermal coefficient of the housing 104) and used to determine one or more adjustments to imaging software. For example, the difference between the new distance h1 and the original distance h1 may reflect an amount of misalignment between the lens assembly 108 and the image sensor 118 that can be adjusted with image processing software.

In some examples, the camera assembly 100 may include a first foam block 140A that is attached to the second surface 102B of the image sensor board 116 and a second foam block 140B that is attached to the first side surface 106A of the connector board 120. The first foam block 140A may extend from the second surface 102B in a direction toward the connector board 120 and the second foam block 140B may extend in a direction toward the image sensor board 116. The foam blocks 140A, 140B may provide a cushioned contact for a portion of the flex circuit 124. Stated another way, a portion of the length of the flex circuit 124 (e.g., between the first end of the flex circuit 124 and the second end of the flex circuit 124) may be sandwiched between the first foam block 140A and the second foam block 140B. In any event, this sandwiched arrangement may prevent or limit movement of the flex circuit 124 in between the foam blocks 140A, 140B. The material of the foam blocks 140A, 140B may be selected to provide cushioning while limiting forces transmitted from the connector board 120 to the image sensor board 116, or vice versa.

The camera assembly 100 may comprise a membrane 134 disposed in a portion of the front housing 104A and/or the rear housing 104B. The membrane 134 may be or comprise a fine, semipermeable mesh that permits gases (e.g., air) to pass therethrough but not liquids (e.g., water, water vapor, moisture, etc.). An exemplary hydrophobic membrane is an oxygen-selective membrane ("OSM") to block, typically at least substantially and more typically entirely, moisture, whether in liquid or gas phase, and carbon dioxide, while passing, typically at least substantially, molecular oxygen. Any OSM may be employed as the membrane 134, such as fluorinated hydrocarbons, polyethers, polyperfloroalkyl oxides or amines, polysiloxanes, silicone oils, fluorinated polysiloxanes, fluorinated polysiloxane copolymer with alkyl methacrylates, Melinex 301H (ML), high density polyethylene (HDPE), silicalite zeolite or PTFE on nickel foam support, silicone oil immobilized in Teflon (PTFE) or nickel/yttria stabilized zirconia (YSZ)/silicate layered membranes, and TCFC configured as a gel, polymer, or liquid immobilized in a porous inert substrate. The membrane 134 may be disposed on and cover one or more slots, holes, apertures, or openings of the camera assembly 100. As shown in FIG. 1E, the membrane 134 may be disposed on the rear housing 104B. The membrane 134 may prevent liquid water or water vapor from entering the interior of the housing 104 and damaging the internal components of the camera assembly 100. In this way, the membrane 134 may ensure that an equal pressure is maintained inside the housing 104 and outside of the housing 104. For instance, the membrane 134 may serve as a pressure regulation valve of the camera assembly 100. Maintaining equal pressure between the inside of the housing 104 and the outside of the housing 104 can ensure that the alignment between various components of the camera assembly 100 are maintained in any ambient environmental condition.

Figure 2A:
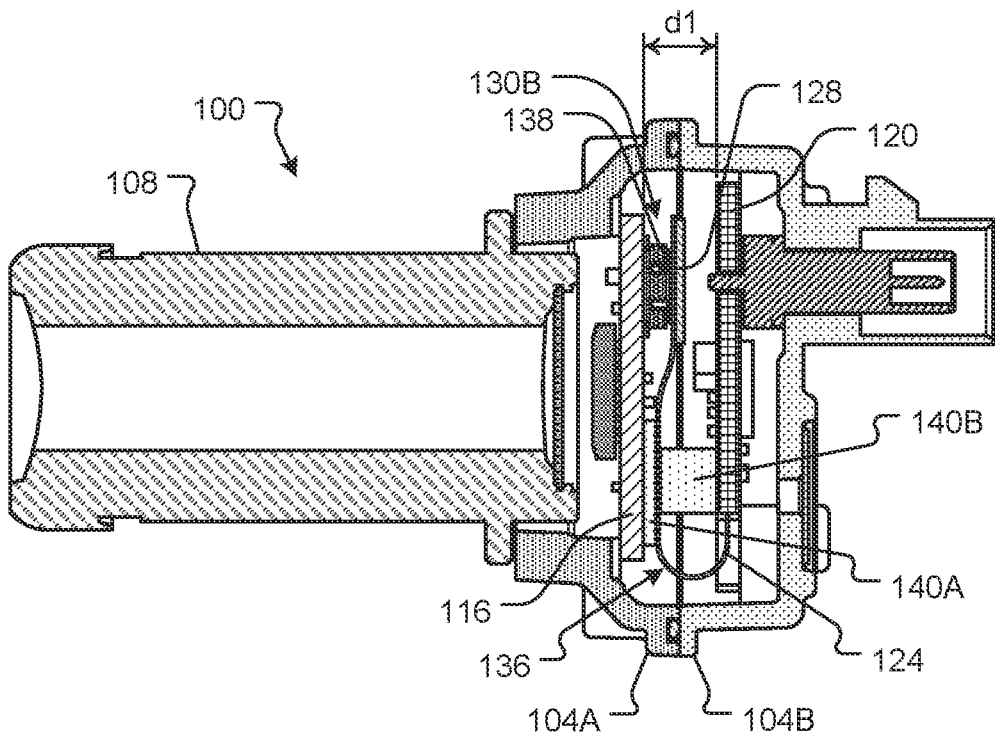
FIG. 2A shows a cross-sectional view of the camera assembly with the housing in a connected state and the flex circuit interconnected to the image sensor board and the connector board in accordance with examples of the present disclosure.
Figure 2B:
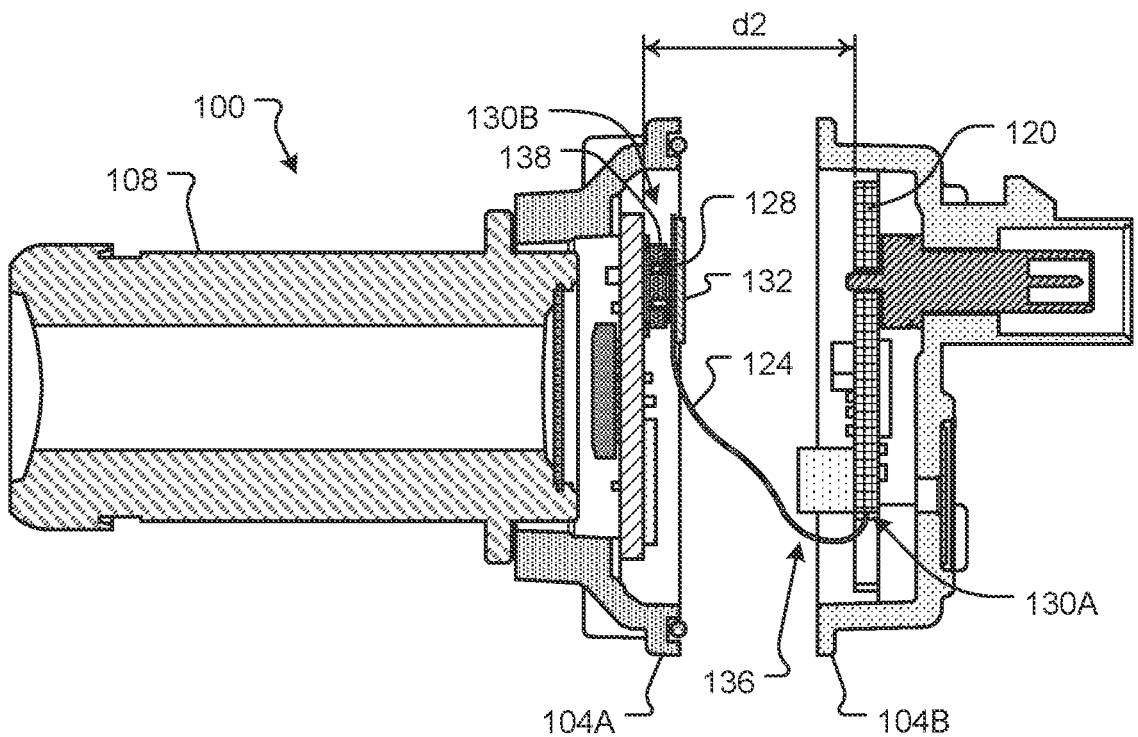
FIG. 2B shows a cross-sectional view of the camera assembly housing in a separated state while the flex circuit remains interconnected to the image sensor board and the connector board in accordance with examples of the present disclosure.
Figure 2C:
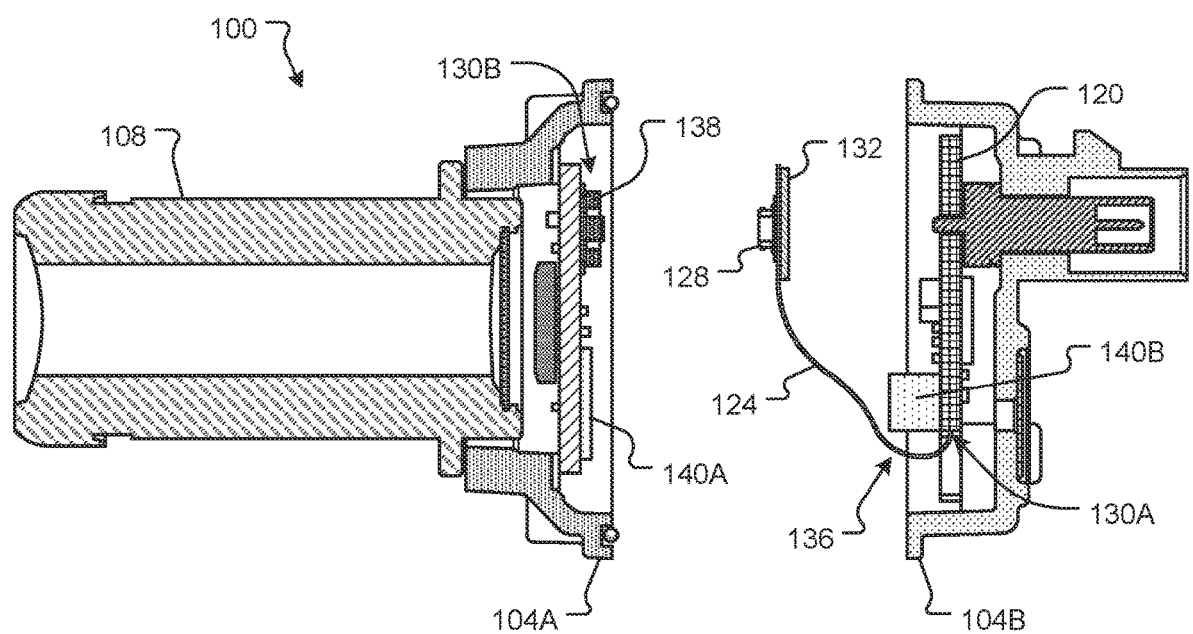
FIG. 2C shows a cross-sectional view of the camera assembly housing in a further separated state with the flex circuit disconnected from the image sensor board and the connector board in accordance with examples of the present disclosure.

Referring to FIGS. 2A-2C, various assembly states of the camera assembly 100 are shown in accordance with examples of the present disclosure. The views shown in FIGS. 2A-2C are shown in cross section to illustrate the arrangement of the flex circuit 124 and/or board-to-board connector 128 in each assembly state. Several components and/or portions of the camera assembly 100 have been removed in FIGS. 2A-2C for clarity. FIG. 2A shows an assembled state of the camera assembly 100 where the flex circuit 124 is interconnected to the image sensor board 116 and the connector board 120 in accordance with examples of the present disclosure. In the assembled state, the main flex bend 136 is arranged in a folded state providing a first bend radius for the flex circuit 124 and the connector board 120 is spaced apart from the image sensor board 116 by a first distance, d1. As illustrated in FIGS. 2B-2C, the housing 104 is separated such that the front housing 104A is disconnected from the rear housing 104B. FIG. 2B shows a first housing-separated state where the front housing 104A is detached from the rear housing 104B and the flex circuit 124 remains connected between the image sensor board 116 and the connector board 120. As the front housing 104A and the rear housing 104B are separated, the main flex bend 136 may move upward (e.g., toward the center of the camera assembly 100, etc.). The flex circuit 124 may be moveable between the assembled state shown in FIG. 2A to the disassembled states shown in FIGS. 2B-2C. In the disassembled state shown in FIG. 2B, the main flex bend 136 is arranged in an at least partially unfolded state providing a second bend radius for the flex circuit 124 (greater than the first bend radius) and the connector board 120 is spaced apart from the image sensor board 116 by a second distance, d2. The second distance, d2, is greater than the first distance, d1. Among other things, this movement may provide room for a user to access and disconnect the board-to-board connector 128 from the receiving connector 138 (as shown in FIG. 2C). FIG. 2C shows a second housing-separated state where the front housing 104A and the image sensor board 116 are completely detached from the connector board 120 and the rear housing 104B, for example, by disconnecting the board-to-board connector 128 of the flex circuit 124 from the receiving connector 138 of the image sensor board 116. In some examples, in the second housing-separated state, the flex circuit 124 may return to an unbent shape and the main flex bend 136 may flatten out (e.g., returning elastically to an original shape, etc.). In one example, the flex circuit 124 may be reattached to the image sensor board 116 by engaging the board-to-board connector 128 of the flex circuit 124 with the receiving connector 138 of the image sensor board 116 (e.g., as shown in FIG. 2B). Once connected, the front housing 104A may be attached to the rear housing 104B (e.g., via the fasteners 103, etc.) to form the housing 104 of the camera assembly 100.

As can be appreciated, moving, in order, from the assembled state (shown in FIG. 2A) to the first housing-separated state (shown in FIG. 2B) and then to the second housing-separated state (shown in FIG. 2C) may correspond to a disassembly operation (e.g., performed during a maintenance and/or access procedure, etc.). On the other hand, moving, in order, from the second housing-separated state (shown in FIG. 2C) to the first housing-separated state (shown in FIG. 2B) and then to the assembled state (shown in FIG. 2A) may correspond to an assembly operation (e.g., performed during manufacturing, after maintenance, etc.).

The exemplary systems and methods of this disclosure have been described in relation to cameras, imaging sensors, flex circuits, printed circuit boards, and lens arrangements. However, to avoid unnecessarily obscuring the present disclosure, the preceding description omits a number of known structures and devices. This omission is not to be construed as a limitation of the scope of the claimed disclosure. Specific details are set forth to provide an understanding of the present disclosure. It should, however, be appreciated that the present disclosure may be practiced in a variety of ways beyond the specific detail set forth herein.

A number of variations and modifications of the disclosure can be used. It would be possible to provide for some features of the disclosure without providing others.

References in the specification to "one embodiment," "an embodiment," "an example embodiment," "some embodiments," etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in conjunction with one embodiment, it is submitted that the description of such feature, structure, or characteristic may apply to any other embodiment unless so stated and/or except as will be readily apparent to one skilled in the art from the description. The present disclosure, in various embodiments, configurations, and aspects, includes components, methods, processes, systems and/or apparatus substantially as depicted and described herein, including various embodiments, subcombinations, and subsets thereof. Those of skill in the art will understand how to make and use the systems and methods disclosed herein after understanding the present disclosure. The present disclosure, in various embodiments, configurations, and aspects, includes providing devices and processes in the absence of items not depicted and/or described herein or in various embodiments, configurations, or aspects hereof, including in the absence of such items as may have been used in previous devices or processes, e.g., for improving performance, achieving ease, and/or reducing cost of implementation.

The foregoing discussion of the disclosure has been presented for purposes of illustration and description. The foregoing is not intended to limit the disclosure to the form or forms disclosed herein. In the foregoing Detailed Description for example, various features of the disclosure are grouped together in one or more embodiments, configurations, or aspects for the purpose of streamlining the disclosure. The features of the embodiments, configurations, or aspects of the disclosure may be combined in alternate embodiments, configurations, or aspects other than those discussed above. This method of disclosure is not to be interpreted as reflecting an intention that the claimed disclosure requires more features than are expressly recited in each claim. Rather, as the following claims reflect, inventive aspects lie in less than all features of a single foregoing disclosed embodiment, configuration, or aspect. Thus, the following claims are hereby incorporated into this Detailed Description, with each claim standing on its own as a separate preferred embodiment of the disclosure.

Moreover, though the description of the disclosure has included description of one or more embodiments, configurations, or aspects and certain variations and modifications, other variations, combinations, and modifications are within the scope of the disclosure, e.g., as may be within the skill and knowledge of those in the art, after understanding the present disclosure. It is intended to obtain rights, which include alternative embodiments, configurations, or aspects to the extent permitted, including alternate, interchangeable and/or equivalent structures, functions, ranges, or steps to those claimed, whether or not such alternate, interchangeable and/or equivalent structures, functions, ranges, or steps are disclosed herein, and without intending to publicly dedicate any patentable subject matter.

Exemplary aspects are directed to a camera assembly, comprising: a first printed circuit board comprising a first surface and a second surface disposed opposite the first surface; a second printed circuit board offset a distance from the first printed circuit board, the second printed circuit board comprising a first side surface and a second side surface disposed opposite the first side surface; an image sensor attached to the first surface of the first printed circuit board; a connector attached to the second side surface of the second printed circuit board; a flex circuit connected to the second printed circuit board at a first connection point, the flex circuit connected to the first printed circuit board at a second connection point, wherein the second connection point comprises a board-to-board connector attached to the flex circuit and a receiving connector attached to the first printed circuit board, wherein the board-to-board connector is selectively attached to the first printed circuit board via the receiving connector, and wherein the flex circuit is moveable between a connected state, where the board-to-board connector is engaged with the receiving connector attached to the first printed circuit board, and a disconnected state, where the board-to-board connector is disengaged from the receiving connector.

Any one or more of the above aspects include wherein at least one of the first printed circuit board and the second printed circuit board are a rigid printed circuit board, and wherein the flex circuit is a flexible circuit that is capable of being elastically bent along a length of the flex circuit. Any one or more of the above aspects include wherein the flex circuit comprises a first side and a second side disposed opposite the first side a thickness of the flex circuit, and wherein the flex circuit is capable of being elastically bent along the length of the flex circuit such that a first portion of the first side is arranged adjacent and facing a second portion of the first side. Any one or more of the above aspects include wherein the board-to-board connector is attached to the first side of the flex circuit, and wherein a stiffener plate is attached to the second side of the flex circuit opposite the board-to-board connector. Any one or more of the above aspects further comprising a housing, the housing comprising: a front housing portion; and a rear housing portion attached to front housing portion, wherein the first printed circuit board is attached to the front housing portion, and wherein the second printed circuit board is attached to the rear housing portion. Any one or more of the above aspects further comprising: a lens stack attached to the front housing portion, wherein a focal point of the lens stack is arranged at the image sensor. Any one or more of the above aspects further comprising: a first foam block attached to the second surface of the first printed circuit board extending in a direction toward the second printed circuit board; and a second foam block attached to the first side surface of the second printed circuit board extending in a direction toward the first printed circuit board, wherein a portion of the flex circuit is arranged between the first foam block and the second foam block. Any one or more of the above aspects include wherein the second side of the flex circuit contacts the first foam block, and wherein the first side of the flex circuit contacts the second foam block. Any one or more of the above aspects include wherein the flex circuit comprises a flex bend disposed between the first printed circuit board and the second printed circuit board, and wherein the flex bend is arranged outside of an area of the first printed circuit board.

Exemplary aspects are directed to a printed circuit board assembly, comprising: a receiving connector; a first printed circuit board comprising a first surface and a second surface disposed opposite the first surface, wherein the receiving connector is attached to the second surface of the first printed circuit board; a second printed circuit board arranged (e.g., parallel to) offset a distance from the first printed circuit board, the second printed circuit board comprising a first side surface and a second side surface disposed opposite the first side surface; a board-to-board connector that selectively engages with the receiving connector; and a flex circuit comprising a length extending from a first end of the flex circuit to a second end of the flex circuit, wherein the board-to-board connector is arranged on a first side of the flex circuit at the second end of the flex circuit, wherein the flex circuit is attached to the second printed circuit board at a first point on the second printed circuit board, and wherein the flex circuit is moveable between a connected state, where the board-to-board connector is engaged with the receiving connector attached to the first printed circuit board, and a disconnected state, where the board-to-board connector is disengaged from the receiving connector.

Any one or more of the above aspects include wherein, in the connected state, the first printed circuit board is electrically interconnected with the second printed circuit board via the flex circuit. Any one or more of the above aspects including an image sensor attached to the first surface of the first printed circuit board. Any one or more of the above aspects including a connector attached to the second side surface of the second printed circuit board. Any one or more of the above aspects include wherein at least one of the first printed circuit board and the second printed circuit board are a rigid printed circuit board that is incapable of being bent, and wherein the flex circuit is a flexible circuit that is capable of being elastically bent along the length of the flex circuit. Any one or more of the above aspects including a stiffener plate arranged on a second side of the flex circuit at the second end of the flex circuit opposite the board-to-board connector. Any one or more of the above aspects including a first foam block attached to the second surface of the first printed circuit board extending in a direction toward the second printed circuit board; and a second foam block attached to the first side surface of the second printed circuit board extending in a direction toward the first printed circuit board, wherein a portion of the flex circuit is arranged between the first foam block and the second foam block. Any one or more of the above aspects include wherein the second side of the flex circuit contacts the first foam block, and wherein the first side of the flex circuit contacts the second foam block. Any one or more of the above aspects include wherein, in the connected state, the flex circuit extends in a first direction away from the second printed circuit board and bends at a flex bend that is arranged at least partially outside an outer periphery of the first printed circuit board, and extends in a second direction toward the receiving connector.

Exemplary aspects are directed to a camera, comprising: a printed circuit board assembly, comprising: a receiving connector; a first printed circuit board comprising a first surface and a second surface disposed opposite the first surface, wherein the receiving connector is attached to the second surface of the first printed circuit board; a second printed circuit board arranged (e.g., parallel to) offset a distance from the first printed circuit board, the second printed circuit board comprising a first side surface and a second side surface disposed opposite the first side surface; a board-to-board connector that selectively engages with the receiving connector; and a flex circuit comprising a length extending from a first end of the flex circuit to a second end of the flex circuit, wherein the board-to-board connector is arranged on a first side of the flex circuit at the second end of the flex circuit, wherein the flex circuit is attached to the second printed circuit board at a first point on the second printed circuit board, and wherein the flex circuit is moveable between a connected state, where the board-to-board connector is engaged with the receiving connector attached to the first printed circuit board, and a disconnected state, where the board-to-board connector is disengaged from the receiving connector; an image sensor attached to the first surface of the first printed circuit board; an external (e.g., coaxial, Ethernet, etc.) connector attached to the second side surface of the second printed circuit board; a housing, comprising: a front housing portion; and a rear housing portion selectively attached to front housing portion, wherein the first printed circuit board is attached to the front housing portion, and wherein the second printed circuit board is attached to the rear housing portion; and a lens stack attached to the front housing portion, wherein a focal point of the lens stack is arranged at the image sensor.

Exemplary aspects are directed to a camera assembly, comprising: a first printed circuit board comprising a first surface and a second surface disposed opposite the first surface; a second printed circuit board offset a distance from the first printed circuit board, the second printed circuit board comprising a first side surface and a second side surface disposed opposite the first side surface; an image sensor attached to the first surface of the first printed circuit board; a connector attached to the second side surface of the second printed circuit board; and a flex circuit connected to the second printed circuit board at a first connection point, the flex circuit connected to the first printed circuit board at a second connection point, wherein a flex bend is disposed between the first connection point and the second connection point, wherein the flex circuit is moveable between an assembled state, where the first printed circuit board is arranged a first distance from the second printed circuit board and the flex bend is arranged in a folded state, and a disassembled state, where the first printed circuit board is arranged a second distance from the second printed circuit board and the flex bend is arranged in an at least partially unfolded state, and wherein the second distance is greater than the first distance.

Any one or more of the above aspects include wherein at least one of the first printed circuit board and the second printed circuit board are a rigid printed circuit board, wherein the flex circuit is a flexible circuit that is capable of being elastically bent along a length of the flex circuit, wherein the second connection point comprises a board-to-board connector attached to the flex circuit and a receiving connector attached to the first printed circuit board, wherein the board-to-board connector is selectively attached to the first printed circuit board via the receiving connector, and wherein the flex circuit is moveable between a connected state, where the board-to-board connector is engaged with the receiving connector attached to the first printed circuit board, and a disconnected state, where the board-to-board connector is disengaged from the receiving connector. Any one or more of the above aspects include wherein the flex bend is disposed between the first printed circuit board and the second printed circuit board, and wherein the flex bend is arranged outside of an area of the first printed circuit board.

Exemplary aspects are directed to a printed circuit board assembly, comprising: a first printed circuit board comprising a first surface and a second surface disposed opposite the first surface; a second printed circuit board arranged offset a distance from the first printed circuit board, the second printed circuit board comprising a first side surface and a second side surface disposed opposite the first side surface; and a flex circuit comprising a length extending from a first end of the flex circuit to a second end of the flex circuit, wherein a flex bend is disposed between the first end and the second end, wherein the flex circuit is moveable between an assembled state, where the first printed circuit board is arranged a first distance from the second printed circuit board and the flex bend is arranged in a folded state, and a disassembled state, where the first printed circuit board is arranged a second distance from the second printed circuit board and the flex bend is arranged in an at least partially unfolded state, and wherein the second distance is greater than the first distance.

Any one or more of the above aspects further comprising: a receiving connector attached to the second surface of the first printed circuit board; and a board-to-board connector arranged on a first side of the flex circuit at the second end of the flex circuit, wherein the board-to-board connector selectively engages with the receiving connector, wherein the flex circuit is attached to the second printed circuit board at a first point on the second printed circuit board, and wherein the flex circuit is moveable between a connected state, where the board-to-board connector is engaged with the receiving connector, and a disconnected state, where the board-to-board connector is disengaged from the receiving connector. Any one or more of the above aspects further comprising: an image sensor attached to the first surface of the first printed circuit board; and an external (e.g., coaxial, Ethernet, etc.) connector attached to the second side surface of the second printed circuit board. Any one or more of the above aspects include wherein, in the connected state, the flex circuit extends in a first direction away from the second printed circuit board and bends at the flex bend and extends in a second direction toward the receiving connector, and wherein, in the connected state, the flex bend is arranged at least partially outside an outer periphery of the first printed circuit board.

Exemplary aspects are directed to a camera assembly, comprising a first sub-assembly, comprising a lens assembly having an optical axis, a first printed circuit board (PCB) including a first surface and a second surface disposed opposite the first surface, and an image sensor attached to the first surface of the first PCB, the optical axis of the lens assembly remaining aligned with a center of the image sensor, The camera assembly also comprises second sub-assembly removably attached to the first sub-assembly, the second sub-assembly comprising a second PCB including a first side surface and a second side surface disposed opposite the first side surface, where the second PCB is offset a distance from the first PCB, and a flex circuit across the first sub-assembly and the second sub-assembly, where the flex circuit is connected to the second PCB at a first connection point, the flex circuit connected to the first PCB at a second connection point, where the flex circuit is moveable between an assembled state, where the first sub-assembly is assembled with the second sub-assembly and the first PCB is arranged a first distance from the second PCB, and a disassembled state, where the first sub-assembly and the second sub-assembly are detached from each other and the first PCB is arranged a second distance from the second PCB, the second distance being greater than the first distance.

Any one or more of the above aspects further comprising a board-to-board connector attached to the flex circuit and a receiving connector attached to the first PCB, where the board-to-board connector is removably attached to the first PCB via the receiving connector, and where the flex circuit is moveable between a connected state, where the board-to-board connector is engaged with the receiving connector attached to the first PCB, and a disconnected state, where the board-to-board connector is disengaged from the receiving connector. Any one or more of the above aspects where the board-to-board connector is attached to a first side of the flex circuit, and where a stiffener plate is attached to a second side of the flex circuit opposite the board-to-board connector. Any one or more of the above aspects further comprising a first foam block attached to the second surface of the first PCB extending in a direction toward the second PCB and a second foam block attached to a first side surface of the second PCB extending in a direction toward the first PCB, where a portion of the flex circuit is arranged between the first foam block and the second foam block. Any one or more of the above aspects where a first side of the flex circuit contacts the first foam block, and where a second side of the flex circuit contacts the second foam block. Any one or more of the above aspects where the first PCB is rigid, where the flex circuit is flexible, and where the second PCB is rigid. Any one or more of the above aspects where the second PCB is rigid and the flex circuit is flexible. Any one or more of the above aspects where the flex circuit is a flexible cable. Any one or more of the above aspects where the first sub-assembly includes a housing that is permanently attached to the lens assembly at a joint location to form the first sub-assembly, and where the image sensor is disposed within the front housing at a predetermined distance from the joint location. Any one or more of the above aspects where the first PCB is disposed entirely within a first housing of the first sub-assembly, and where the second PCB is disposed entirely within a second housing of the second sub-assembly.

Exemplary aspects are directed to a camera assembly, comprising a first sub-assembly comprising a first housing, a first printed circuit board (PCB) disposed at least partially within the first housing, an image sensor attached to a first surface of the first PCB, and a lens assembly with an optical axis that is aligned with a center of the image sensor, the lens assembly connected to the first housing, a second sub-assembly comprising a second housing, and a second PCB disposed at least partially within the second housing, and a flex circuit extending from the first sub-assembly to the second sub-assembly, where the flex circuit is connected to the first PCB and to the second PCB, where the second sub-assembly is movable relative to the first sub-assembly from a first state where the second sub-assembly is connected to the first sub-assembly to a second state where the second sub-assembly is disconnected from the first sub-assembly, where the second PCB is a first distance from the first PCB in the first state, and where the second PCB is a second distance from the first PCB in the second state, and where the second distance is greater than the first distance.

Any one or more of the above aspects further comprising a board-to-board connector attached to the flex circuit and a receiving connector attached to the first PCB, where the board-to-board connector is removably attached to the first PCB via the receiving connector, and where the flex circuit is moveable between a connected state, where the board-to-board connector is engaged with the receiving connector attached to the first PCB, and a disconnected state, where the board-to-board connector is disengaged from the receiving connector. Any one or more of the above aspects where the board-to-board connector is attached to a first side of the flex circuit, and where a stiffener plate is attached to a second side of the flex circuit opposite the board-to-board connector. Any one or more of the above aspects further comprising a first foam block attached to a first surface of the first PCB extending in a direction toward the second PCB, and a second foam block attached to a first side surface of the second PCB extending in a direction toward the first PCB, where a portion of the flex circuit is arranged between the first foam block and the second foam block. Any one or more of the above aspects where a first side of the flex circuit contacts the first foam block, and where a second side of the flex circuit contacts the second foam block. Any one or more of the above aspects where the first PCB is rigid, where the flex circuit is flexible, and where the second PCB is rigid. Any one or more of the above aspects where the second PCB is rigid and the flex circuit is flexible. Any one or more of the above aspects where the flex circuit is a flexible cable. Any one or more of the above aspects where the first housing is permanently attached to the lens assembly at a joint location, and where the image sensor is disposed within the first housing at a predetermined distance from the joint location. Any one or more of the above aspects where the first PCB is disposed entirely within the first housing of the first sub-assembly, and where the second PCB is disposed entirely within a second housing of the second sub-assembly.

Any one or more of the above aspects/embodiments as substantially disclosed herein.

Any one or more of the aspects/embodiments as substantially disclosed herein optionally in combination with any one or more other aspects/embodiments as substantially disclosed herein.

One or means adapted to perform any one or more of the above aspects/embodiments as substantially disclosed herein.

Any one or more of the features disclosed herein.

Any one or more of the features as substantially disclosed herein.

Any one or more of the features as substantially disclosed herein in combination with any one or more other features as substantially disclosed herein.

Any one of the aspects/features/embodiments in combination with any one or more other aspects/features/embodiments.

Use of any one or more of the aspects or features as disclosed herein.

It is to be appreciated that any feature described herein can be claimed in combination with any other feature(s) as described herein, regardless of whether the features come from the same described embodiment.

As used herein, the singular forms "a," "an," and "the" are intended to include the plural forms as well, unless the context clearly indicates otherwise. It will be further understood that the terms "include," "including," "includes," "comprise," "comprises," and/or "comprising," when used in this specification, specify the presence of stated features, integers, steps, operations, elements, and/or components, but do not preclude the presence or addition of one or more other features, integers, steps, operations, elements, components, and/or groups thereof. The term "and/or" includes any and all combinations of one or more of the associated listed items.

The term "a" or "an" entity refers to one or more of that entity. As such, the terms "a" (or "an"), "one or more," and "at least one" can be used interchangeably herein. It is also to be noted that the terms "comprising," "including," and "having" can be used interchangeably.

The phrases "at least one," "one or more," "or," and "and/or" are open-ended expressions that are both conjunctive and disjunctive in operation. For example, each of the expressions "at least one of A, B and C," "at least one of A, B, or C," "one or more of A, B, and C," "one or more of A, B, or C," and "A, B, and/or C" means A alone, B alone, C alone, A and B together, A and C together, B and C together, or A, B, and C together. When each one of A, B, and C in the above expressions refers to an element, such as X, Y, and Z, or a class of elements, such as $X_1$-$X_n$, $Y_1$-$Y_m$, and $Z_1$-$Z_o$, the phrase is intended to refer to a single element selected from X, Y, and Z, a combination of elements selected from the same class (e.g., $X_1$ and $X_2$) as well as a combination of elements selected from two or more classes (e.g., $Y_1$ and $Z_0$).

The term "automatic" and variations thereof, as used herein, refers to any process or operation, which is typically continuous or semi-continuous, done without material human input when the process or operation is performed. However, a process or operation can be automatic, even though performance of the process or operation uses material or immaterial human input, if the input is received before performance of the process or operation. Human input is deemed to be material if such input influences how the process or operation will be performed. Human input that consents to the performance of the process or operation is not deemed to be "material."

The terms "determine," "calculate," "compute," and variations thereof, as used herein, are used interchangeably and include any type of methodology, process, mathematical operation, or technique.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and this disclosure.

It should be understood that every maximum numerical limitation given throughout this disclosure is deemed to include each and every lower numerical limitation as an alternative, as if such lower numerical limitations were expressly written herein. Every minimum numerical limitation given throughout this disclosure is deemed to include each and every higher numerical limitation as an alternative, as if such higher numerical limitations were expressly written herein. Every numerical range given throughout this disclosure is deemed to include each and every narrower numerical range that falls within such broader numerical range, as if such narrower numerical ranges were all expressly written herein.

What is claimed is:

1. A camera assembly, comprising:
    a first sub-assembly, comprising:
        a lens assembly having an optical axis;
        a first printed circuit board (PCB) including a first surface and a second surface disposed opposite the first surface; and
        an image sensor attached to the first surface of the first PCB, the optical axis of the lens assembly remaining aligned with a center of the image sensor;
    a second sub-assembly removably attached to the first sub-assembly, the second sub-assembly comprising:

a second PCB including a first side surface and a second side surface disposed opposite the first side surface, wherein the second PCB is offset a distance from the first PCB; and a flex circuit electronically connecting the first PCB and the second PCB, wherein the flex circuit is moveable between an assembled state, where the first sub-assembly is assembled with the second sub-assembly and the first PCB is arranged a first distance from the second PCB, and a disassembled state, where the first sub-assembly and the second sub-assembly are detached from each other and the first PCB is arranged a second distance from the second PCB, the second distance being greater than the first distance, and wherein, when in the disassembled state, the flex circuit remains interconnected to the first PCB and to the second PCB;

a first foam block attached to the second surface of the first PCB extending in a direction toward the second PCB; and a second foam block attached to a first side surface of the second PCB extending in a direction toward the first PCB, wherein a portion of the flex circuit is arranged between the first foam block and the second foam block.

2. The camera assembly of claim 1, wherein the first PCB is removably connected to the second PCB at a connection point.

3. The camera assembly of claim 1, further comprising:
a surface mount connector attached to the flex circuit and a receiving connector attached to the first PCB, wherein the surface mount connector is removably attached to the first PCB via the receiving connector, and wherein the flex circuit is moveable between a connected state, where the surface mount connector is engaged with the receiving connector attached to the first PCB, and a disconnected state, where the surface mount connector is disengaged from the receiving connector.

4. The camera assembly of claim 3, wherein the surface mount connector is attached to a first side of the flex circuit, and wherein a stiffener plate is attached to a second side of the flex circuit opposite the surface mount connector.

5. The camera assembly of claim 1, wherein a first side of the flex circuit contacts the first foam block, and wherein a second side of the flex circuit contacts the second foam block.

6. The camera assembly of claim 1, wherein the first PCB, the flex circuit, and the second PCB form a rigid-flex-rigid PCB assembly.

7. The camera assembly of claim 1, wherein at least one of the first PCB and the second PCB and the flex circuit form a rigid-flex PCB assembly.

8. The camera assembly of claim 1, wherein the flex circuit is a flexible cable.

9. The camera assembly of claim 1, wherein the first sub-assembly includes a housing that is permanently attached to the lens assembly at a joint location to form the first sub-assembly, and wherein the image sensor is disposed within the housing at a predetermined distance from the joint location.

10. The camera assembly of claim 1, wherein the first PCB is disposed within a first housing of the first sub-assembly independently of the second PCB, and wherein the second PCB is disposed within a second housing of the second sub-assembly independent of the first PCB.

11. A camera assembly, comprising:
a front housing comprising:
a first printed circuit board (PCB) disposed within the front housing; and
an image sensor attached to a first surface of the first PCB;
a rear housing comprising a second PCB disposed within the rear housing;
a flex circuit extending from the front housing to the rear housing, wherein the flex circuit is connected to the first PCB and to the second PCB, wherein the rear housing is moveable relative to the front housing from a first state where the rear housing is attached to the front housing to a second state where the rear housing is detached from the front housing, wherein the second PCB is at a first distance from the first PCB in the first state, wherein the second PCB is at a second distance from the first PCB in the second state, wherein the second distance is greater than the first distance, and wherein, when in the second state, the flex circuit remains interconnected to the first PCB and to the second PCB;
a first foam block attached to a first surface of the first PCB extending in a direction toward the second PCB; and
a second foam block attached to a first side surface of the second PCB extending in a direction toward the first PCB, wherein a portion of the flex circuit is arranged between the first foam block and the second foam block.

12. The camera assembly of claim 11, further comprising:
a lens assembly attached to the front housing, the lens assembly having an optical axis that is aligned with a center of the image sensor; and
a surface mount connector attached to the flex circuit and a receiving connector attached to the first PCB, wherein the surface mount connector is removably attached to the first PCB via the receiving connector, and wherein the flex circuit is moveable between a connected state, where the surface mount connector is engaged with the receiving connector attached to the first PCB, and a disconnected state, where the surface mount connector is disengaged from the receiving connector.

13. The camera assembly of claim 12, wherein the surface mount connector is attached to a first side of the flex circuit, and wherein a stiffener plate is attached to a second side of the flex circuit opposite the surface mount connector.

14. The camera assembly of claim 11, wherein a first side of the flex circuit contacts the first foam block, and wherein a second side of the flex circuit contacts the second foam block.

15. The camera assembly of claim 11, wherein the first PCB, the flex circuit, and the second PCB form a rigid-flex-rigid PCB assembly.

16. The camera assembly of claim 11, wherein at least one of the first PCB and the second PCB and the flex circuit form a rigid-flex PCB assembly.

17. The camera assembly of claim 11, wherein the flex circuit is a flexible cable.

18. The camera assembly of claim 11, wherein the front housing is permanently attached to a lens assembly at a joint location, and wherein the image sensor is disposed within the front housing at a predetermined distance from the joint location.

19. The camera assembly of claim 11, wherein the first PCB is disposed within the front housing independently of the second PCB, and wherein the second PCB is disposed within the rear housing independently of the first PCB.

20. The camera assembly of claim 11, wherein the first PCB is removably connected to the second PCB at a connection point.

\* \* \* \* \*